United States Patent
Komada et al.

(10) Patent No.: US 9,030,089 B2
(45) Date of Patent: May 12, 2015

(54) LIGHTING DEVICE FOR GROWING PLANT

(71) Applicants: Satoshi Komada, Osaka (JP); Katsuyuki Konishi, Osaka (JP)

(72) Inventors: Satoshi Komada, Osaka (JP); Katsuyuki Konishi, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 184 days.

(21) Appl. No.: 13/676,978

(22) Filed: Nov. 14, 2012

(65) Prior Publication Data

US 2013/0127329 A1    May 23, 2013

(30) Foreign Application Priority Data

Nov. 18, 2011 (JP) .................................. 2011-253196

(51) Int. Cl.
| | |
|---|---|
| *F21V 9/16* | (2006.01) |
| *F21V 9/02* | (2006.01) |
| *A01G 7/04* | (2006.01) |
| *H05B 33/08* | (2006.01) |
| *H01L 25/075* | (2006.01) |
| *H01L 33/50* | (2010.01) |

(52) U.S. Cl.
CPC ... *F21V 9/16* (2013.01); *F21V 9/02* (2013.01); *A01G 7/045* (2013.01); *H05B 33/0857* (2013.01); *H05B 33/0872* (2013.01); *H01L 25/0753* (2013.01); *H01L 33/502* (2013.01); *H01L 33/504* (2013.01)

(58) Field of Classification Search
CPC ........................................ F21V 9/16; F21V 9/02
See application file for complete search history.

(56) References Cited

U.S. PATENT DOCUMENTS

| | | | |
|---|---|---|---|
| 2009/0014741 A1* | 1/2009 | Masuda et al. .................. | 257/98 |
| 2011/0085352 A1* | 4/2011 | Ito et al. ......................... | 362/617 |
| 2012/0056216 A1* | 3/2012 | Mitsuishi et al. ............... | 257/89 |
| 2013/0037846 A1 | 2/2013 | Harada et al. | |

FOREIGN PATENT DOCUMENTS

| | | |
|---|---|---|
| JP | 2002-27831 | 1/2002 |
| JP | 2007-129062 | 5/2007 |
| JP | 2008-235680 | 10/2008 |
| JP | 2008-258356 | 10/2008 |
| JP | 2008258356 A * | 10/2008 |
| JP | 2010-29098 | 2/2010 |
| JP | 2011-225696 | 11/2011 |

* cited by examiner

*Primary Examiner* — Elmito Breval
(74) *Attorney, Agent, or Firm* — Morrison & Foerster LLP

(57) ABSTRACT

A lighting device for growing a plant includes: not less than two sorts of semiconductor light-emitting element, each having a peak emission wavelength in a range of 380 nm to 500 nm, the not less than two sorts of semiconductor light-emitting element being different from each other in peak emission wavelength by not less than 5 nm; and a red fluorescent material which (i) is excited by light of at least one of the not less than two sorts of semiconductor light-emitting element and (ii) has a peak emission wavelength in a range of 600 nm to 780 nm.

13 Claims, 8 Drawing Sheets

LIGHTING DEVICE FOR GROWING PLANT

This Nonprovisional application claims priority under 35 U.S.C. §119 on Patent Application No. 2011-253196 filed in Japan on Nov. 18, 2011, the entire contents whose are hereby incorporated by reference.

TECHNICAL FIELD

The present invention relates to a lighting device for growing a plant by promoting photosynthesis of the plant.

BACKGROUND ART

In recent years, a technique for growing an edible plant or an ornamental plant, irrespective of a season, has been developed. A light source using artificial light is one of such techniques. An absorption spectrum of a photosynthetic pigment related to photosynthesis of a plant is mainly in a blue color region and a red color region, and light in such regions is considered important for growing a plant. Accordingly, a light source that generates light in the blue color region and the red color region is widely known as a light source for growing a plant.

As a light source for growing a plant, a light-emitting diode (hereinafter referred to as "LED") that can be adjusted in wavelength freely attracts attention. For example, Patent Literature 1 discloses an LED light source for growing a plant, which LED light source uses an LED that generates both (i) light having a wavelength in a range of 400 nm to 480 nm (blue color) and (ii) light having a wavelength in a range of 650 nm to 700 nm (red color). Moreover, Patent Literature 2 discloses a lighting device for growing a plant, which lighting device supplies light necessary for a plant to grow in such a manner that (i) a fluorescent material for emitting blue light is excited by use of an ultraviolet LED and (ii) a fluorescent material for emitting red light is excited by use of an ultraviolet LED.

CITATION LIST

Patent Literature

Patent Literature 1
Japanese Patent Application Publication, Tokukai, No. 2002-27831 A (Publication Date: Jan. 29, 2002)
Patent Literature 2
Japanese Patent Application Publication, Tokukai, No. 2010-29098 A (Publication Date: Feb. 12, 2010)

SUMMARY OF INVENTION

Technical Problem

There are various sorts of photosynthetic pigment of a plant, and the various sorts of photosynthetic pigment have different absorption spectrums. As such, for each of a blue color region and a red color region, a broad emission spectrum is effective. With the LED light source for growing a plant, described in Patent Literature 1, the LED emits blue light and red light. In this case, however, a half-value width of the emission spectrum becomes narrow. For this reason, such an LED light source is not effective in growing a plant efficiently.

Further, with the lighting device described in Patent Literature 2, it is possible to obtain broad light by exciting both a blue fluorescent material and a red fluorescent material. However, according to a technique of Patent Literature 2, it is difficult to provide a light source having a high light-emitting efficiency because (i), at present, a light-emitting efficiency of the ultraviolet LED is lower than that of the blue LED, (ii) an increase in stokes shift causes a reduction in a light conversion efficiency of the fluorescent materials, and (iii) an excitation efficiency of the blue fluorescent material is low. As such, the lighting device described in Patent Literature 2 requires more operating power in order to obtain a necessary luminous flux.

The present invention is made in view of the problems mentioned above. An object of the present invention is to provide a lighting device which is capable of growing a plant efficiently with low power consumption.

Solution to Problem

In order to attain the object, a lighting device of the present invention, for growing a plant, includes: not less than two sorts of semiconductor light-emitting element, each having a peak emission wavelength in a range of 380 nm to 500 nm, the not less than two sorts of semiconductor light-emitting element being different from each other in peak emission wavelength by not less than 5 nm; and a red fluorescent material which (i) is excited by light of at least one of the not less than two sorts of semiconductor light-emitting element and (ii) has a peak emission wavelength in a range of 600 nm to 780 nm.

According to the arrangement described above, a lighting device of the present invention, for growing a plant, supplies (i) light that has a peak emission wavelength in a blue color region (from 380 nm to 500 nm) and (ii) light that has a peak emission wavelength in a red color region (from 600 nm to 780 nm). The light having a peak emission wavelength in the blue color region and the light having a peak wavelength in the red color region can be absorbed easily by photosynthetic pigments (chlorophyll a, chlorophyll b, chlorophyll c, etc.) of a plant. Further, for the blue color region, the lighting device includes the not less than two sorts of semiconductor light-emitting element, which are different from each other in peak emission wavelength by not less than 5 nm. As such, the lighting device can supply light having a wavelength in a broad range. This makes it possible to provide light having an absorption wavelength for each of a wider variety of photosynthetic pigments. Accordingly, it becomes possible to cause a plant to grow efficiently. In addition, as compared with a case where a blue fluorescent material is excited by an ultraviolet LED to emit blue light, a semiconductor blue light-emitting element has a higher light-emitting efficiency. It is therefore possible to have a reduction in power consumption.

Furthermore, light in the red color region is generated by the red fluorescent material, which is excited by light generated by the semiconductor light-emitting element. As such, as compared with a case where a red LED is used to emit light, a half-value width becomes broad. This makes it possible to grow a plant efficiently. Moreover, as compared with a case where the red fluorescent material is excited by use of an ultraviolet LED, the power consumption can be reduced. This is because the semiconductor blue light-emitting element has a high light-emitting efficiency.

Further, the scope of the present invention includes a blue light lighting device including: not less than two sorts of semiconductor light-emitting element, each having a peak emission wavelength in a range of 380 nm to 500 nm, which range is a range of an absorption wavelength of a photosynthetic pigment, the not less than two sorts of semiconductor light-emitting element being different from each other in peak emission wavelength by not less than 5 nm.

According to the arrangement of the blue-light lighting device above, a lighting device of the present invention, for growing a plant, supplies light that has a peak emission wavelength in a blue color region (from 380 nm to 500 nm). The light having a peak emission wavelength in the blue color region can be absorbed easily by photosynthetic pigments (chlorophyll a, chlorophyll b, chlorophyll c, etc.) of a plant. Further, the lighting device includes the not less than two sorts of semiconductor light-emitting element, which are different from each other in peak emission wavelength by not less than 5 nm. As such, the lighting device can supply light having a wavelength in a broad range. This makes it possible to provide light having an absorption wavelength for each of a wider variety of photosynthetic pigments. Accordingly, it becomes possible to cause a plant to grow efficiently. In addition, as compared with a case where a blue fluorescent material is excited by an ultraviolet LED to emit blue light, a semiconductor blue light-emitting element has a higher light-emitting efficiency. It is therefore possible to have a reduction in power consumption.

Advantageous Effects of Invention

The lighting device of the present invention, for growing a plant, can grow a plant efficiently with low power consumption.

DESCRIPTION OF EMBODIMENTS

Embodiment 1

Figure 1:
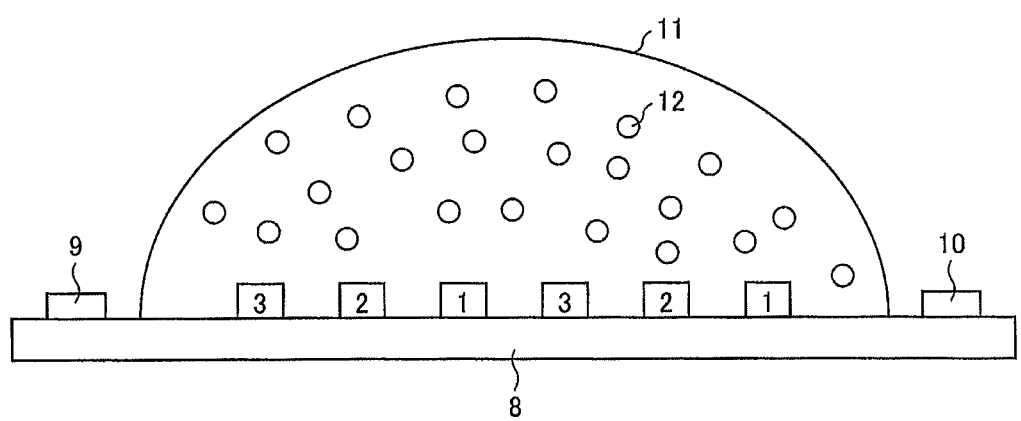
FIG. 1 is a cross-sectional view illustrating an LED package included in a lighting device for growing a plant, in accordance with Embodiment 1 of the present invention.
Figure 2:
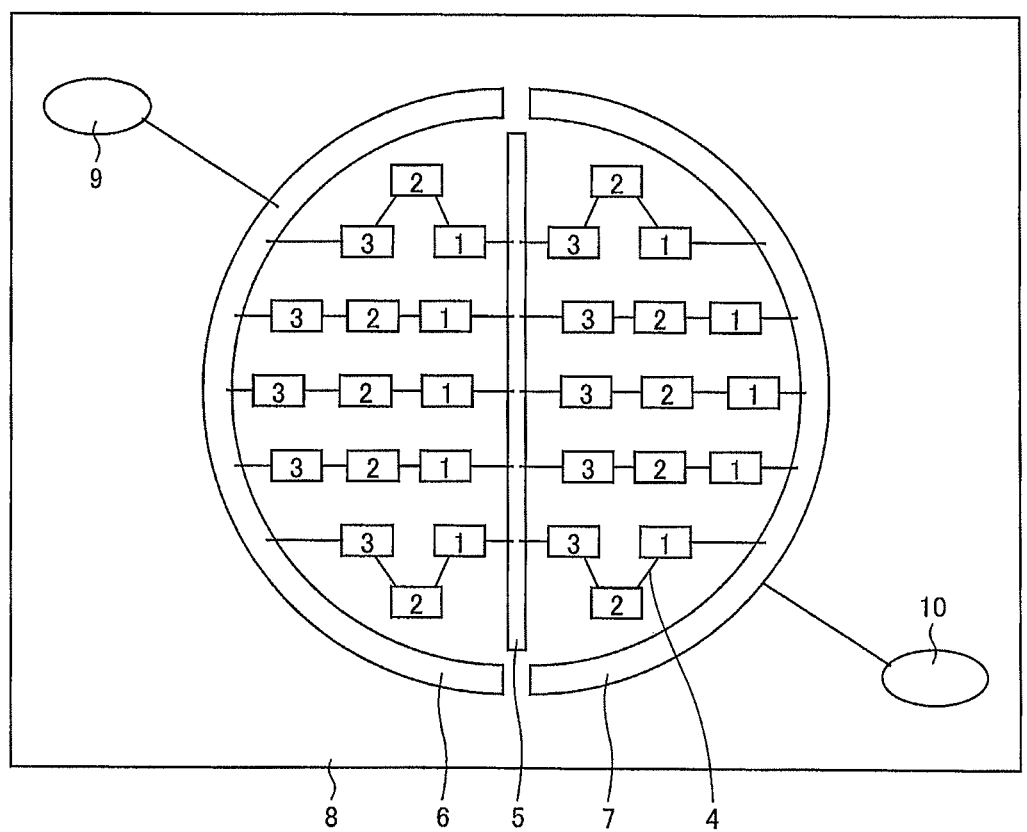
FIG. 2 is a view illustrating an example of an arrangement of blue LEDs that constitute a blue light-emitting region of the LED package illustrated in FIG. 1.
Figure 3:
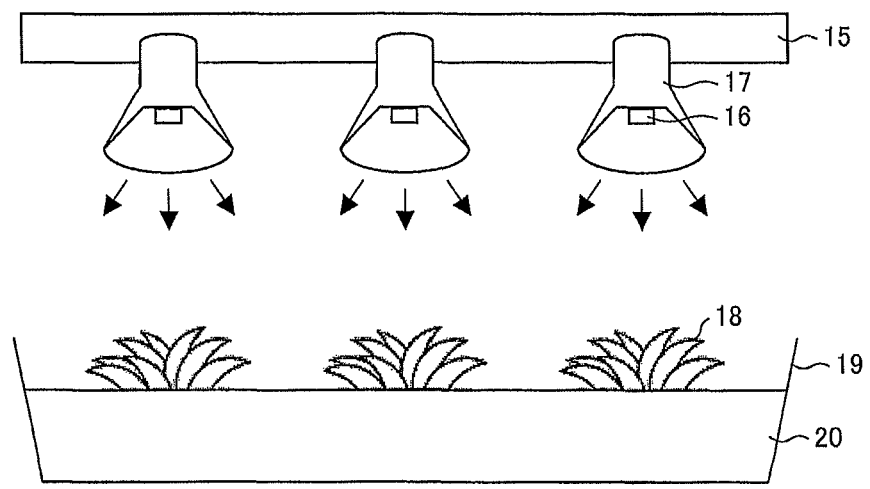
FIG. 3 is a view illustrating an example of how the lighting device of the present invention, for growing a plant, emits light toward a plant.
Figure 8:
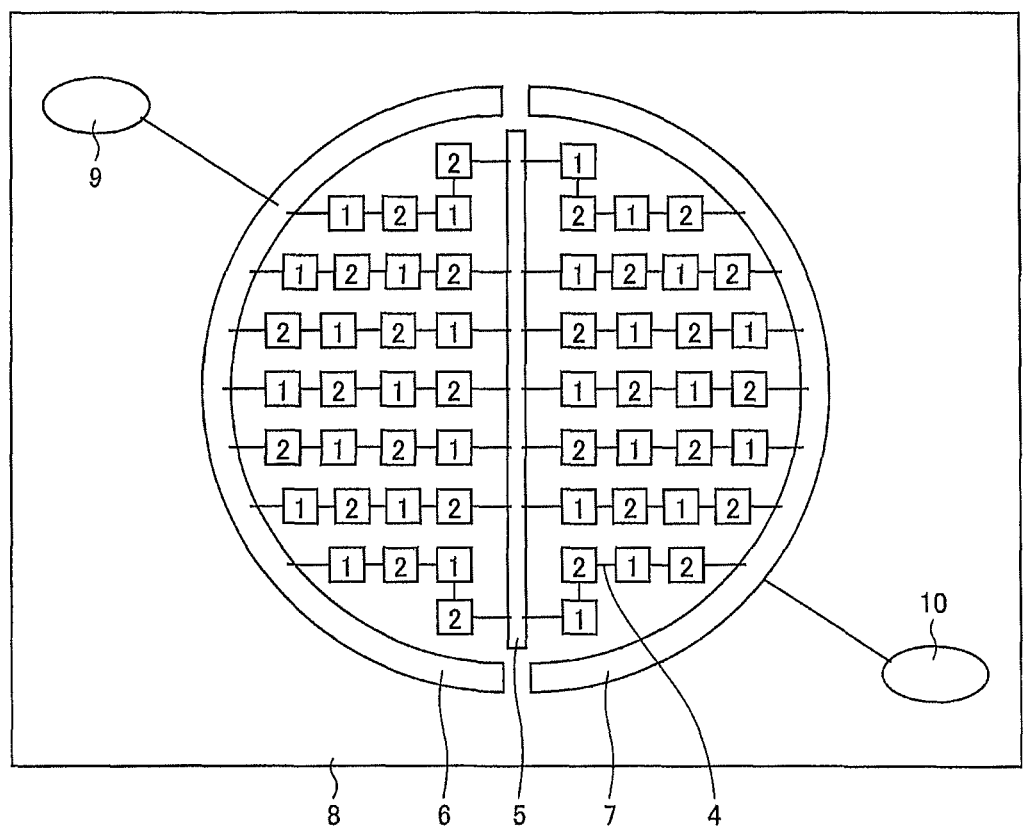
FIG. 8 is a view illustrating another example of an arrangement of blue LEDs in the lighting device of the present invention, for growing a plant.

One embodiment (Embodiment 1) of a lighting device of the present invention, for growing a plant, is described below with reference to FIGS. 2, 6, and 8. FIG. 1 is a cross-sectional view illustrating an LED package included in the lighting device for growing a plant, in accordance with Embodiment 1 of the present invention. FIG. 2 is a view illustrating an example of an arrangement of blue LEDs that constitute a blue light-emitting region of the LED package illustrated in FIG. 1. FIG. 3 is a view illustrating an example of how the lighting device for growing a plant emits light toward a plant, in accordance with Embodiment 1 of the present invention.

In the lighting device for growing a plant, in accordance with Embodiment 1, the blue LEDs illustrated in FIG. 2 emit blue light to a red fluorescent material for emitting red light, and therefore the red fluorescent material is excited and emits red light.

A part constituting a blue light-emitting region of the LED package illustrated in FIG. 1 is such that three sorts of LED element (semiconductor light-emitting element) are arranged on a substrate 8 (see FIG. 2). The LED elements are connected to each other via wiring lines 4. The wiring lines 4 are connected to a cathode electrode 6, an anode electrode 7, and gold 5 so that the cathode electrode 6 and the anode electrode 7 are connected to each other via the gold 5. The cathode electrode 6 is connected to a pad electrode 9, and the anode electrode 7 is connected to a pad electrode 10. All of the cathode electrode 6, the anode electrode 7, the pad electrode 9, and the pad electrode 10 are provided on the substrate 8.

As described above, three sorts of LED element are provided. Hereinafter, the three sorts of LED element are referred to as "first LED element 1", "second LED element 2", and "third LED element 3", respectively. The LED package has an arrangement in which (i) five wiring lines 4 are connected, in parallel with each other, between the anode electrode 7 and the gold 5 so that the anode electrode 7 and the gold 5 are connected to each other via each of the five wiring line 4, and (ii) a single first LED element, a single second LED element, and a single third LED element are connected, in this order, in series, to each of the five wiring lines 4 via which the anode electrode 7 and the gold 5 are connected to each other. Further, the LED package has an arrangement in which (i) five wiring lines 4 are connected, in parallel with each other, between the gold 5 and the cathode electrode 6 so that the gold 5 and the cathode electrode 6 are connected to each other via each of the five wiring line 4, and (ii) a single first LED element, a single second LED element, and a single third LED element are connected, in this order, in series, to each of the five wiring lines 4 via which the gold 5 and the cathode electrode 6 are connected to each other.

As described below with reference to FIG. 1, the first LED elements 1, the second LED elements 2, and the third LED elements 3, arranged as described above, are sealed with a sealing resin 11 in which a red fluorescent material 12 is mixed, so as to form a single structure. The structure thus sealed, the substrate 8, the pad electrode 9, and the pad electrode 10 constitute an LED package 16 illustrated in FIG. 3.

Details of an arrangement illustrated in FIG. 2 are described below.

(Semiconductor Light-Emitting Element)

The first LED element 1, the second LED element 2, and the third LED element 3 are identical with each other in having a peak emission wavelength in a range of 380 nm to 500 nm, which range is a range of an absorption wavelength of a photosynthetic pigment. However, the first LED element 1, the second LED element 2, and the third LED element 3 are different from each other in peak emission wavelength by not less than 5 nm.

In nature, many sorts of photosynthetic pigment exist. Examples of such a photosynthetic pigment encompass chlorophyll, carotenoid, and phycobilin. The chlorophyll is classified into chlorophyll a, chlorophyll b, chlorophyll c, chlorophyll d, or the like. Further, the chlorophyll a has many molecular species.

Absorption spectrums of such photosynthetic pigments vary from photosynthetic pigment to photosynthetic pigment. However, in a short wavelength region of visible light, many of the photosynthetic pigments (particularly chlorophyll) have a peak of an absorption spectrum in a range of 380 nm to 500 nm (a blue color region). For this reason, the lighting device for growing a plant, in accordance with Embodiment 1, emits light in the blue color region, so that the light is absorbed by the photosynthetic pigments easily.

Furthermore, a half-value width of an emission spectrum of an LED is approximately 30 nm at maximum. As such, it is difficult for a single sort of LED to emit light so that light is provided for each of various absorption wavelengths of the photosynthetic pigments. However, the lighting device for growing a plant, in accordance with Embodiment 1, includes a plurality of sorts (three sorts in Embodiment) of LED element (the first LED element 1, the second LED element 2, and the third LED element 3), which are different from each other in peak wavelength by not less than 5 nm. That is, the lighting device of Embodiment 1 emits light so that light is provided for absorption wavelengths of a wider variety of photosynthetic pigments. Note that the difference of not less than 5 nm exceeds a usual range for variation of a wavelength generated due to a manufacturing tolerance of an LED, or the like.

By providing a plurality of LED elements which are different from each other in peak wavelength by not less than 5 nm as described above, it becomes possible to grow a plant efficiently. Moreover, the semiconductor light-emitting element for emitting blue light has a higher light-emitting efficiency, as compared with a case where a blue fluorescent material is excited by use of an ultraviolet LED so as to emit blue light. Accordingly, it is possible to suppress power consumption.

A green plant (higher plant, green alga) and the like mainly use chlorophyll a and chlorophyll b as a photosynthetic pigment for obtaining energy. In other words, among the photosynthetic pigments, chlorophyll is particularly important because of its function of obtaining energy.

Figure 4:
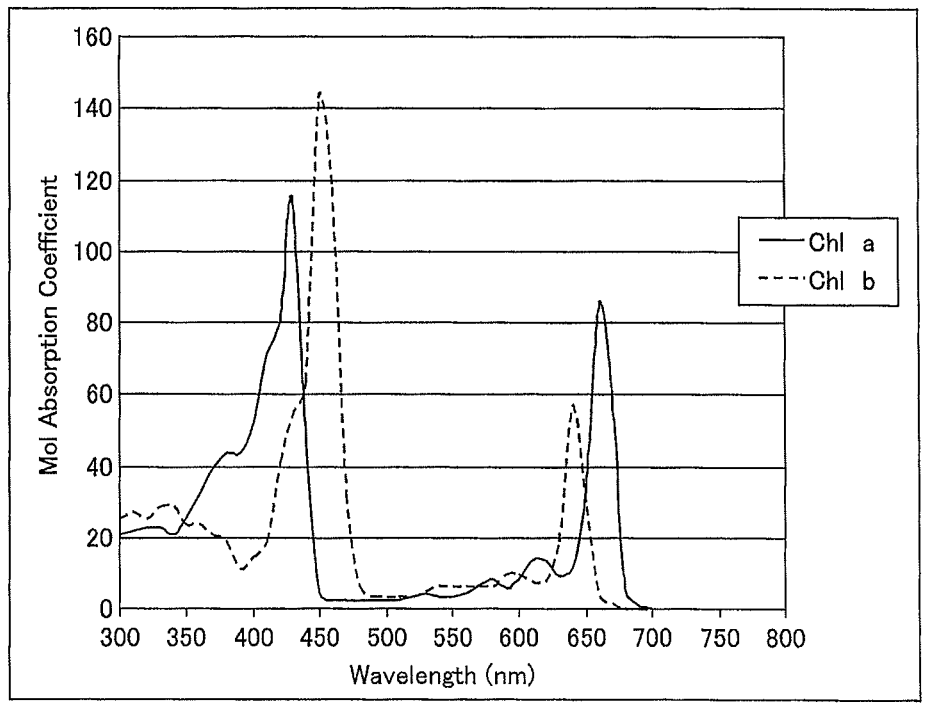
FIG. 4 shows an absorption spectrum of chlorophyll a and an absorption spectrum of chlorophyll b.

Here, FIG. 4 shows an absorption spectrum of chlorophyll a and an absorption spectrum of chlorophyll b. In a Soret band (B band), chlorophyll a (Chl a in FIG. 4) has a peak absorption wavelength of 428 nm, and has, in a range of not more than 390 nm, an absorption coefficient of not less than one-third of a peak. Meanwhile, chlorophyll b (Chl b in FIG. 4) has a peak absorption wavelength of 452 nm, and has, in a range of not more than 420 nm, an absorption coefficient of not less than one-fourth of a peak. As such, it is preferable that the first LED element 1, the second LED element 2, and the third LED element 3 have a peak emission wavelength in a range of, approximately, 390 nm to 460 nm. For example, the first LED element 1 has a peak emission wavelength of 410 nm, the second LED element 2 has a peak emission wavelength of 430 nm, and the third LED element 3 has a peak emission wavelength of 450 nm. In consideration of only peak absorption wavelengths of chlorophyll a and chlorophyll b, the LED package can also have such an arrangement that two sorts of LED element, having peak emission wavelengths of 430 nm and 450 nm, respectively, are used (described later in Embodiment 3).

Further, a diatom, a brown alga, and the like mainly use chlorophyll a and chlorophyll c as a photosynthetic pigment for obtaining energy. Chlorophyll c has peak absorption wavelengths of 446 nm, 445 nm, and 452 nm, which are similar to the peak absorption wavelength of chlorophyll b. As such, the same arrangement as the arrangement described above can be used.

The first LED element 1, the second LED element 2, and the third LED element 3 are configured so as to have peak emission wavelengths in a range of ±40 nm of the peak absorption wavelength(s) of chlorophyll(s), because there is a certain range for an absorption wavelength of chlorophyll, as described above.

It is particularly preferable that the first LED element 1, the second LED element 2, and the third LED element 3 have peak wavelengths in at least two ranges of within ±40 nm with respect to two peak values, namely, (i) a range of ±40 nm of a peak value in the Soret band of the absorption spectrum of one of chlorophyll a, chlorophyll b, and chlorophyll c, which are distributed in many species, and (ii) a range of within ±40 nm of a peak value in the Soret band of the absorption spectrum of another one of chlorophyll a, chlorophyll b, and chlorophyll c. In particular, it is preferable that the two ranges are (i) a range of within ±40 nm of a peak value in the Soret band of the absorption spectrum of chlorophyll a which is found in a green plant, a diatom, a brown alga, and the like in common, and (ii) a range of within ±40 nm of a peak value in the Soret band of the absorption spectrum of one of chlorophyll b, which is found in a green plant, and chlorophyll c, which is found in a diatom, a brown alga, and the like. For example, it is preferable that the first LED element 1, the second LED element 2, and the third LED element are a group of LED elements having peak emission wavelengths which are in two or three ranges selected from the followings: (1) a range of within ±40 nm with respect to 428 nm; (2) a range of within ±40 nm with respect to 452 nm; and (3) a range of within ±40 nm with respect to 446 nm, 445 nm, or 452 nm.

Moreover, carotenoid, which is one of the photosynthetic pigments, is a pigment that has an antioxidation effect and is essential for protection of a cell. β-carotene, lutein, violaxanthin, α-carotene, and zeaxanthin are included in most of chloroplasts of land plants in common. β-carotene has peak absorption wavelengths of 449 nm and 475 nm, lutein has peak absorption wavelengths of 443 nm and 470 nm, violaxanthin has peak absorption wavelengths of 436 nm and 466 nm, α-carotene has peak absorption wavelengths of 442 nm and 471 nm, and zeaxanthin has peak absorption wavelengths of 448 nm and 475 nm. As to each of these pigments, a peak absorption wavelength on a short wavelength side is close to a peak absorption wavelength of chlorophyll. It follows that, for such a peak absorption wavelength on the short wavelength side, light can be emitted from the first LED element 1, the second LED element 2, and the third LED element 3. Further, in a case where one of the first LED element 1, the second LED element 2, and the third LED element 3 has a peak emission wavelength in a range of 460 nm to 480 nm, it is possible that, for a peak absorption wavelength of the carotenoid, on a long wavelength side, light is also emitted.

As described above, the lighting device for growing a plant, in accordance with Embodiment 1, has the arrangement in which the first LED element 1, the second LED element 2, and the third LED element 3 have peak emission wavelengths in a range of 380 nm to 500 nm. It is therefore possible for a photosynthetic pigment to absorb light efficiently.

The first LED element 1, the second LED element 2, and the third LED element 3 may be known LED elements. Note, however, that it is preferable that the first LED element 1 is a nitride semiconductor having a peak emission wavelength of 430 nm, the second LED element 2 is a nitride semiconductor having a peak emission wavelength of 450 nm, and the third LED element 3 is a nitride semiconductor having a peak emission wavelength of 470 nm, for example. This is because, by changing an In composition of an active layer of the nitride semiconductor, it is possible to achieve such wavelengths easily. Moreover, in consideration of a high light-emitting efficiency, the nitride semiconductor is suitably used.

The lighting device for growing a plant, in accordance with Embodiment 1, has an arrangement in which, on the substrate 8, the first LED element 1, the second LED element 2, and the third LED element 3 are connected to each other in series via the wiring line 4. Here, as illustrated in FIG. 2, a single first LED element 1, a single second LED element 2, and a single third LED element 3 are connected to each other in this order so as to constitute a single LED unit. In this case, by arranging such LED units so that (i) two or more LED units are connected to each other in series to constitute an LED row, (ii) two or more such LED rows are connected in parallel with each other, and (iii) such LED rows are identical with each other in a total forward voltage of LEDs, it is possible to (I) carry out driving without having differences between such LED rows in current value, and therefore (II) have a reduction in differences between parts of the LED package in color. Here, the LEDs of each LED row are not limited to the above arrangement in which the LED units, each being constituted by the first LED element, the second LED element, and the third LED element connected to each other in this order, is repeated, as long as the LED rows are identical with each other in the number of first LED elements, the number of second LED elements, and the number of third LED elements.

Examples of a material of the substrate 8 encompass ceramic, silicon, and glass. In the present embodiment, an LED element is used as a semiconductor light-emitting element. Note, however, that the present invention is not limited to this. A semiconductor laser can be also used as the semiconductor light-emitting element. Further, in a case where a plurality of semiconductor light-emitting elements are provided, it is possible to employ a combination of the LED element and the semiconductor laser.

(Red Fluorescent Material)

A red fluorescent material 12 illustrated in FIG. 1 is a fluorescent material which (i) is excited by light emitted from at least one sort of the first LED element 1, the second LED element 2, and the third LED element 3, and (ii) has a peak emission wavelength in a range of 600 nm to 780 nm.

As shown in FIG. 4, in a Q band (long wavelength region of visible light), chlorophyll a has a peak absorption wavelength of 600 nm, and chlorophyll b has a peak absorption wavelength of 642 nm. The lighting device for growing a plant, in accordance with Embodiment 1, emits light in a red color region, which light can be easily absorbed by these photosynthetic pigments.

Figure 5:
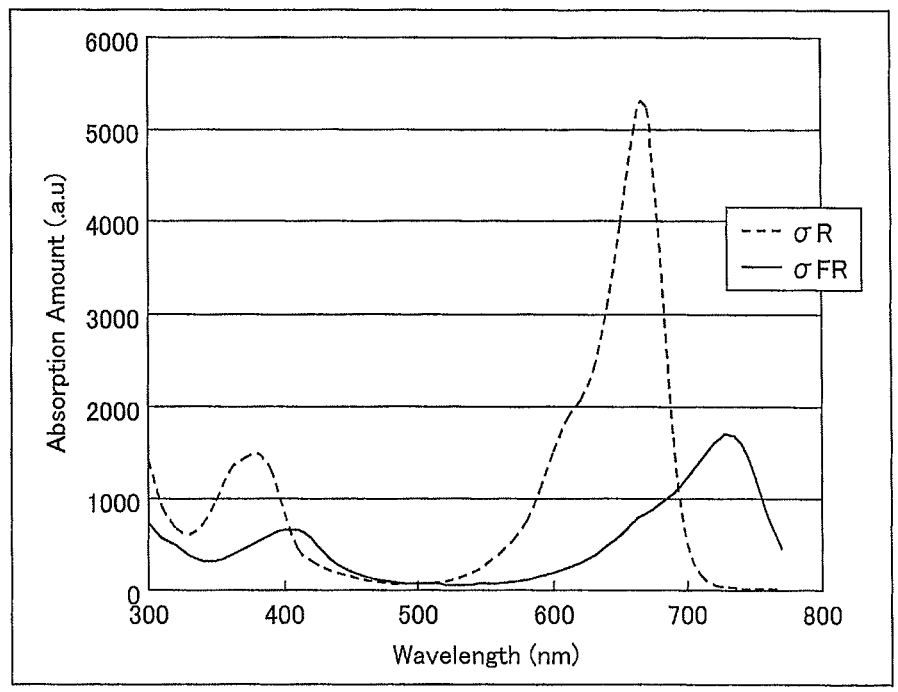
FIG. 5 shows an absorption spectrum of phytochrome.

Further, phytochrome is one of pigments greatly related to growth of a plant. Phytochrome is related to promotion of flowering of a plant, and the like. An absorption spectrum of phytochrome is shown in FIG. 5. Phytochrome has two peak absorption wavelengths of 666 nm and 730 nm. Phytochrome absorbs light having these wavelengths, so as to adjust germination and flowering. The lighting device for growing a plant, in accordance with Embodiment 1, emits light in the red color region, which light can be easily absorbed by phytochrome.

The red fluorescent material 12 is a fluorescent material which emits broad red light (from 600 nm to 780 nm) whose half-value width is not less than 50 nm. Such a fluorescent material 12 has a half-value width wider than that of an LED for emitting red light. It is thus possible to grow a plant efficiently. Moreover, the semiconductor light-emitting element (the first LED element 1, the second LED element 2, and the third LED element 3) for emitting blue light has a higher light-emitting efficiency, as compared with a case where a red fluorescent material is excited by use of an ultraviolet LED. For this reason, it is possible to reduce power consumption of the entire lighting device.

Specifically, in accordance with the peak absorption wavelength of chlorophyll a and the peak absorption wavelength of chlorophyll b, the red fluorescent material 12 can be a red fluorescent material that has a peak emission wavelength of 650 nm, for example.

For example, it is preferable that the red fluorescent material 12 is a bivalent europium-activated nitride fluorescent material represented (substantially) by the following general formula (A): $(MIV_{1-c}Eu_c)$ $MVSiN_3$ (wherein: MIV represents at least one sort of element selected from a group consisting of Mg, Ca, Sr, and Ba; MV is at least one sort of element selected from a group consisting of Al, Ga, In, Sc, Y, La, Gd, and Lu; and $0.001 \leq c \leq 0.15$). The bivalent europium-activated nitride fluorescent material has a broad half-value width of approximately 100 nm, and as such, can provide a wavelength for a wide range in the red color region. Accordingly, with the bivalent europium-activated nitride fluorescent material, it is possible to provide light for absorption wavelengths of a wider variety of photosynthetic pigments, and therefore to cause a plant to grow more efficiently. In this case, the peak emission wavelength of the bivalent europium-activated nitride fluorescent material is set to be in a range of, approximately, 600 nm to 710 nm.

Moreover, it is preferable that the red fluorescent material 12 be constituted by two or more sorts of red fluorescent material, which are different from each other in peak emission wavelength. Such a red fluorescent material 12 can provide light for a wider range of a wavelength in the red color region, and therefore can provide light for absorption wavelengths of a wider variety of photosynthetic pigments. The not less than two sorts of red fluorescent material can be obtained, for example, by changing an atomic composition ratio between Mg, Ca, Sr of MIV in the general formula (A). In a case where an atomic composition ratio of Sr is increased with respect to that of Ca, the peak emission wavelength is shifted toward a short wavelength side. In a case where an atomic composition ratio of Mg is increased with respect to that of Ca, the peak emission wavelength is shifted toward a long wavelength side. Further, the not less than two sorts of red fluorescent material can be also obtained by changing an atomic composition ratio of Eu with respect to that of MIV in the general formula (A). In a case where the atomic composition ratio of Eu is increased with respect to that of MIV, the peak emission wavelength is shifted toward the long wavelength side.

It is preferable that the not less than two sorts of red fluorescent material are the bivalent europium-activated nitride fluorescent material represented by the general formula (A), and are different from each other in an atomic composition ratio between Mg, Ca, and Sr of MIV. Moreover, it is preferable that the not less than two sorts of red fluorescent material are the bivalent europium-activated nitride fluorescent material represented by the general formula (A), and are different from each other in an atomic composition ratio of Eu with respect to that of MIV.

Further, as a fluorescent material corresponding to an absorption peak of phytochrome (i.e., 730 nm), a $Gd_3Ga_5O_{12}$:Cr fluorescent material can be added. The $Gd_3Ga_5O_{12}$:Cr fluorescent material successfully absorbs a wavelength of light (the blue color region) emitted from the semiconductor light-emitting element, and therefore is excited, and, as a result, emits near infrared light (whose peak is around 730 nm).

The not less than two sorts of red fluorescent material can be mixed with a resin simultaneously. Alternatively, the not less than two sorts of red fluorescent material can be mixed with a resin, separately, in turn, from a position on an LED element side.

(Green Light-Emitting Material)

It is preferable that the lighting device for growing a plant, in accordance with Embodiment 1, further includes a green light-emitting material for emitting green light having a wavelength that is more than 500 nm but less than 600 nm.

Figure 6:
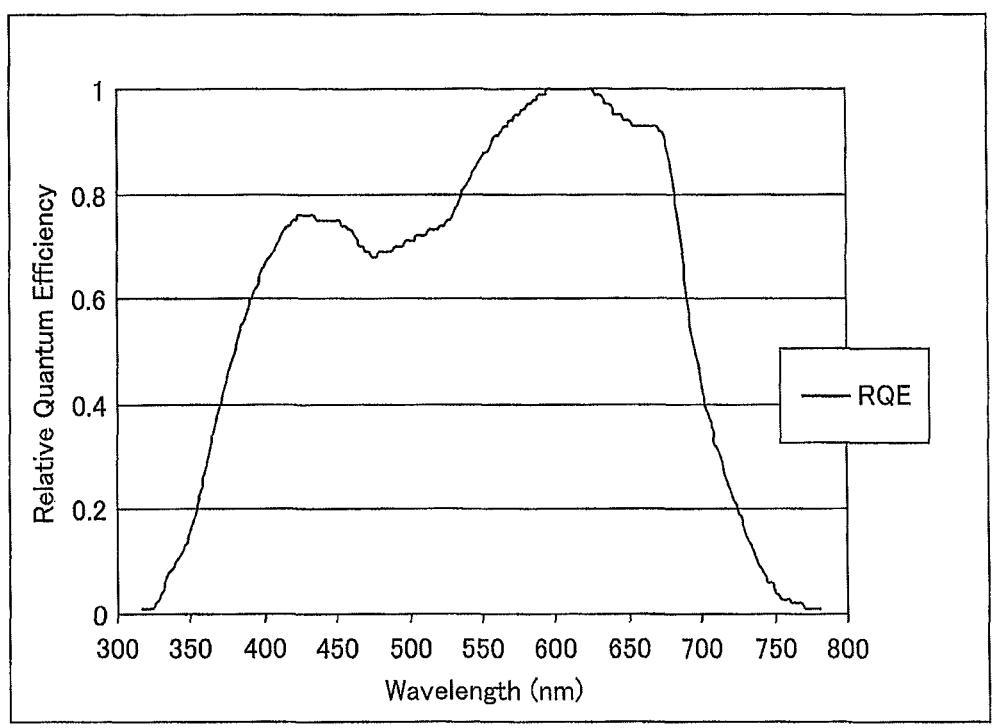
FIG. 6 shows a relative quantum efficiency of each wavelength.

FIG. 6 shows a relationship between (i) a relative quantum efficiency (RQE) that indicates an ability of photon to cause photosynthesis and (ii) a wavelength. As shown in FIG. 6, the RQE in a green color region (from 500 nm to 600 nm) is high, and the green color region is considered as being related to photosynthesis. In fact, it is known that light in the green color region is also used to carry out photosynthesis on an underside of a leaf, which light in the blue color region and light in the red color region are not likely to reach. As such, in a case where the lighting device of the present embodiment further includes a green fluorescent material, it is possible to promote photosynthesis of the entire leaf. It is thus possible to cause a plant to grow more efficiently. In addition, the light in the green color region is excellent in visibility characteristic of a human body. For this reason, an improvement in workability can be expected.

The green light-emitting material can be an LED, a fluorescent material, and the like, each of which emits green light having a wavelength that is more than 500 nm but less than 600 nm. The green light-emitting material can be constituted by not less than two sorts of green light-emitting materials which are different from each other in peak emission wavelength. The not less than two sorts of green light-emitting material can be a combination of an LED and a fluorescent material. Moreover, the LED for emitting green light can be driven by a power source which is different from a power source for the first LED element 1, the second LED element 2, and the third LED element 3, and can be connected in series or in parallel with respect to the first LED element 1, the second LED element 2, and the third LED element 3.

Further, it is preferable that the lighting device for growing a plant, in accordance with Embodiment 1, includes a green fluorescent material that (i) is excited by light emitted from at least one of the first LED element 1, the second LED element 2, and the third LED element 3 and (ii) has a peak emission wavelength in a range of 480 nm to 600 nm. This is because the green fluorescent material can emit light in a broad range, and can emit light for a wavelength in a wide range of a green color region. A wavelength related to photosynthesis is found through the entire green color region, as described above. As such, with the arrangement, the lighting device for growing a plant, in accordance with Embodiment 1, can grow a plant efficiently.

As such a green fluorescent material, it is preferable to employ $(Lu_{1-x}Ce_x)_3Al_5O_{13}$ ($0.001 \leq x \leq 0.05$). This green fluorescent material has a wide half-value width of approximately 100 nm. That is, it becomes possible to widen a range of a wavelength that can be provided in the green color region. As such, it is possible to provide light for absorption wavelengths of a wider variety of sorts of photosynthetic pigment. It becomes therefore possible to grow a plant more efficiently.

Further, the green fluorescent material can be constituted by not less than two sorts of green fluorescent material, which are different from each other in peak emission wavelength.

Furthermore, the green fluorescent material can be constituted by not less than two sorts of green fluorescent material, which are different from each other in emission spectrum.

The not less than two sorts of green fluorescent material can be mixed with a resin simultaneously, or the not less than two sorts of green fluorescent material can be mixed separately, in turn, from a position on an LED element side. Further, the green fluorescent material and the red fluorescent material 12 can be mixed with a resin simultaneously, or the green fluorescent material and the red fluorescent material 12 can be mixed separately, in turn, from a position on the LED element side.

Irradiation Example

As illustrated in FIG. 3, for example, it is possible that the lighting device for growing a plant, in accordance with Embodiment 1, is attached to a top board 15, covered with an aluminum frame 17, and emits light toward a target plant 18 that is planted in soil 20 in a pot 19. This makes it possible to promote growth of the plant (including germination, flowering, etc.). Note that the plant is not limited to the plant 18 illustrated in FIG. 3. It is also possible to emit light to a plant or algae that grows in water, so as to promote growth of such a plant or algae.

It is possible to adjust a spectrum freely by (i) preparing a power supply circuit for each of the sorts of LED element and (ii) controlling each of the sorts of LED element independently. As such, it is possible to provide light having a desirable wavelength, more successfully, in accordance with a sort of a plant or a growth stage of the plant.

Embodiment 2

Figure 7:
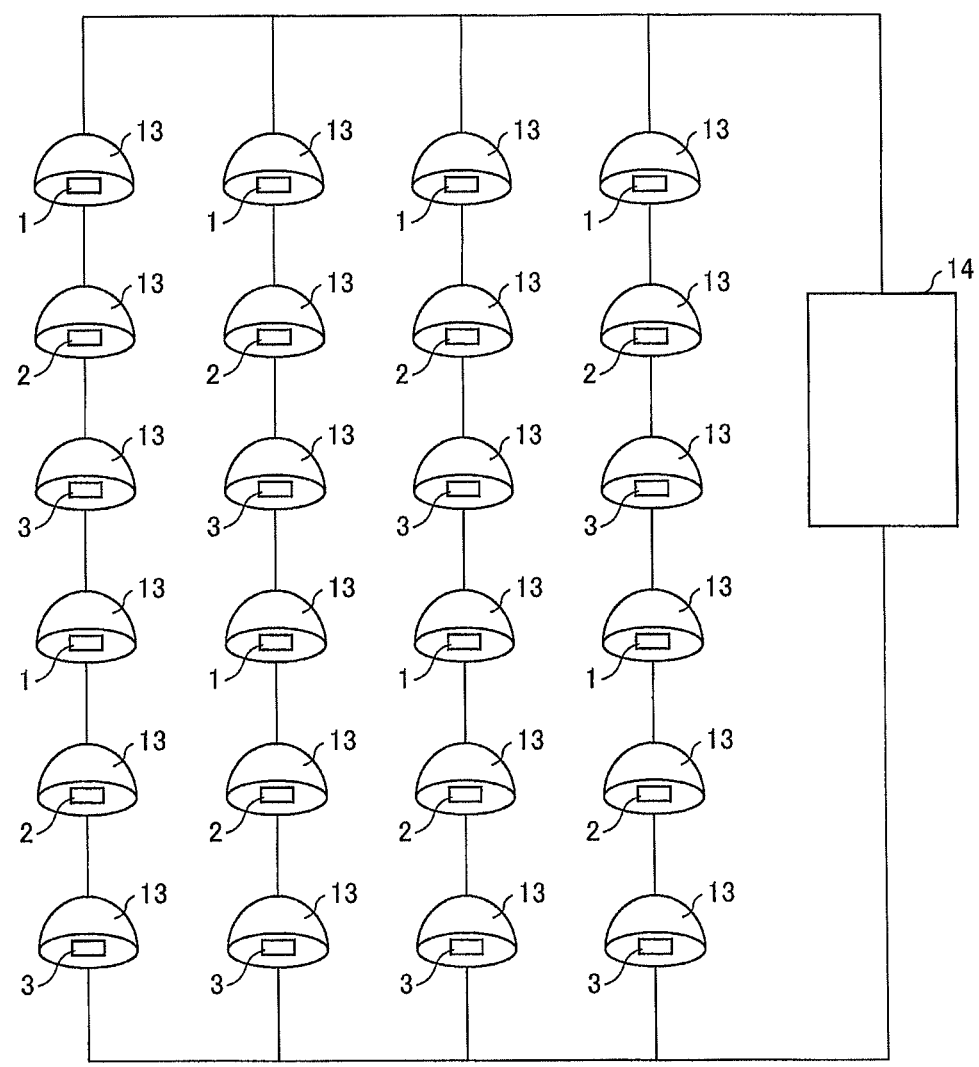
FIG. 7 is a view illustrating another example of an arrangement of red fluorescent materials in the lighting device of the present invention, for growing a plant.

Another embodiment (Embodiment 2) of the lighting device of the present invention, for growing a plant, is described below with reference to FIG. 7. FIG. 7 illustrates a lighting device for growing a plant, in accordance with Embodiment 2 of the present invention.

According to Embodiment 1 described above, (i) a first LED element 1, a second LED element 2, and a third LED element 3 are connected to each other in series, so as to form an LED row, (ii) a plurality of such LED rows are connected in parallel with each other, and (iii) the plurality of LED rows are entirely sealed with a sealing resin (a sealing resin containing a fluorescent material) so as to form a single LED package. Meanwhile, the lighting device for growing a plant, in accordance with Embodiment 2, has an arrangement in which (i) each of a plurality of LED elements is sealed with a sealing resin separately on a substrate 8, so as to form an LED package, (ii) six LED packages are connected to each other in series via a wiring line 4 to form an LED row, (iii) four LED rows are connected in parallel with each other, and (iv) the wiring line 4 is connected to a power supply 14 (see FIG. 7). Further, the sealing reign with which each of the plurality of LED elements is sealed is a sealing reign 13 in which at least a red fluorescent material 12 is mixed, as with a reign of Embodiment 1.

A material of each of LED elements, namely, a first LED element 1, a second LED element 2, and a third LED element 3, is the same as a material described in Embodiment 1. In the lighting device for growing a plant, in accordance with Embodiment 2, the LED rows, connected in parallel with each other, are identical with each other in a total of forward voltages of the LED elements connected to each other in series, in the same manner as Embodiment 1. As such, it is possible to (i) drive the lighting device without having differences in current value between the LED rows, and therefore (ii) reduce differences in color (wavelength) between parts of the LED lighting device.

A material of a red fluorescent material 12 is the same as a material described in Embodiment 1. In a case where the red fluorescent material 12 is constituted by not less than two sorts of red fluorescent material, all the not less than two sorts of red fluorescent material 12 are not necessarily mixed with the sealing reign 13 for sealing each of the plurality of LED elements. For example, it is possible that (i) a red fluorescent material 12 that greatly absorbs light of an LED element 1 is provided only in a sealing resin for sealing the LED element 1, and (ii) another red fluorescent material 12 that greatly absorbs light of an LED element 2 is provided only in a sealing resin for sealing the LED element 2. In this case, it is possible to excite such red fluorescent materials efficiently.

According to the present embodiment, a green light-emitting material can be also employed. The green light-emitting material is the same as a green light-emitting material described in Embodiment 1.

Embodiment 3

Another embodiment (Embodiment 3) of a lighting device of the present invention, for growing a plant, is described below with reference to FIG. 8. FIG. 8 illustrates an example of an arrangement of an LED group that constitutes a blue light-emitting region in the lighting device (blue light lighting device) for growing a plant, in accordance with Embodiment 3 of the present invention.

In Embodiment 1 described above, three sorts of blue LED elements (a first LED element, a second LED element, and a third LED element) are used. Meanwhile, in Embodiment 3, an LED group that constitutes a blue light-emitting region is constituted by two sorts of LED element (semiconductor light-emitting element). The two sorts of LED element have peak emission wavelengths of 430 nm and 450 nm, respectively, in accordance with only peak absorption wavelengths of chlorophyll.

A first LED element 1 and a second LED element 2 are connected to each other in series via a wiring line 4, so as to form an LED group. Moreover, seven LED groups are connected in parallel with each other. Here, in the present embodiment, a plurality of LED elements are arranged in a mesh pattern so that LED elements that have the same peak emission wavelength are not placed next to each other. In other words, in each of the LED groups, an LED element 1 and an LED element 2 are connected to each other alternately in series. Further, the LED groups are connected in parallel with each other so that (i) an LED element 1 of one of the LED groups and an LED element 1 of adjacent one of the LED groups are not placed next to each other, and (ii) an LED element 2 of one of the LED groups and an LED element 2 of adjacent one of the LED groups are not placed next to each other. Accordingly, the lighting device for growing a plant, in accordance with Embodiment 3, can supply a plant with blue light that is synthesized homogeneously.

In the present embodiment, two sorts of LED element are employed. Note, however, that the present embodiment is not limited to this, and it is possible to employ three sorts of LED element so that LED elements of the same sort are arranged not to be adjacent to each other. Various arrangements can be employed. Note, however, that it is preferable that all sorts of LED element are arranged uniformly as a whole. For example, in a case where three sorts of LED element (an LED element 1, an LED element 2, and an LED element 3) are employed, three sorts of the LED elements 1 to 3 can be arranged uniformly as a whole in such a manner that (i) in a first LED group, the LED elements are arranged such that an LED element 1, an LED element 2, and an LED element 3 constitutes one unit in this order, and the unit is provided repeatedly, (ii) in a second LED group next to the first LED group, the LED elements are arranged such that an LED element 2, an LED element 3, and an LED element 1 constitutes one unit in this order, and the unit is provided repeatedly, (iii) in a third LED group next to the second LED group, the LED elements are arranged such that an LED element 3, an LED element 1, and an LED element 2 constitute one unit in this order, and the unit is provided repeatedly, (iv) in a fourth LED group next to the third LED group, the LED elements are arranged such that an LED element 1, an LED element 2, and an LED element 3 constitute one unit in this order, and the unit is provided repeatedly, and (v) the first LED group, the second LED group, the third LED group, and the fourth LED group are arranged in parallel with each other.

According to the present embodiment, a red fluorescent material and a green fluorescent material can be used in the same manner as Embodiments 1 and 2.

The present invention is not limited to the description of the embodiments above, but may be altered by a skilled person within the scope of the claims. An embodiment based on a proper combination of technical means disclosed in different embodiments is encompassed in the technical scope of the present invention.

Example

An example of a lighting device of the present invention, for growing a plant, is described below. The present example deals with an arrangement illustrated in FIG. 8.

The lighting device of the present example, for growing a plant, was manufactured as described below. A plurality of first LED chips, each having a peak emission wavelength of 430 nm, and a plurality of second LED chips, each having a peak emission wavelength of 450 nm, were prepared. The plurality of first LED chips and the plurality of second LED chips were arranged in a mesh pattern on a single ceramic substrate (see FIG. 8). Each of the plurality of first LED chips and each of the plurality of second LED chips are attached via a silicon resin. A blue light-emitting region was thus manufactured.

Then, a red fluorescent material was mixed in a silicon resin. An amount of the red fluorescent material was adjusted so that a ratio of a photon flux of light emitted from the LED chips to a photon flux of light emitted from the red fluorescent material became 1:1. The LED chips were sealed with such the silicon resin containing the red fluorescent material. A lighting device employing LEDs having two peak wavelengths was thus manufactured (Example of the present invention).

For comparison, another lighting device was manufactured. The another lighting device had the same arrangement as the lighting device of the present example, except that the plurality of first LED chips each having a peak wavelength of 430 nm were replaced with the plurality of second LED chips each having a peak wavelength of 450 nm (arrangement employing LEDs having one peak wavelength)

Comparative Example

Figure 9:
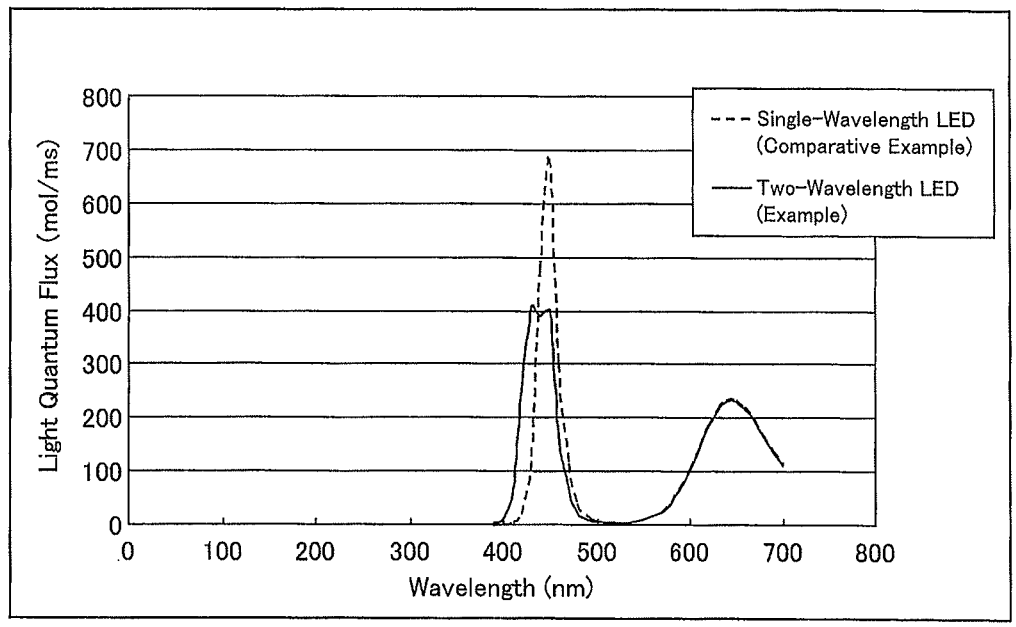
FIG. 9 shows a measurement result of a photon flux of each wavelength, which measurement result was obtained in Example of the present invention.

An emission spectrum of Example and an emission spectrum of Comparison Example were measured with the use of a spectral radiometer (Otsuka Electronics Co., Ltd., LE3x00 series). Results of the measurement are shown in FIG. 9. FIG. 9 indicates a spectrum corresponding to a light radiation flux of each wavelength.

Figure 10:
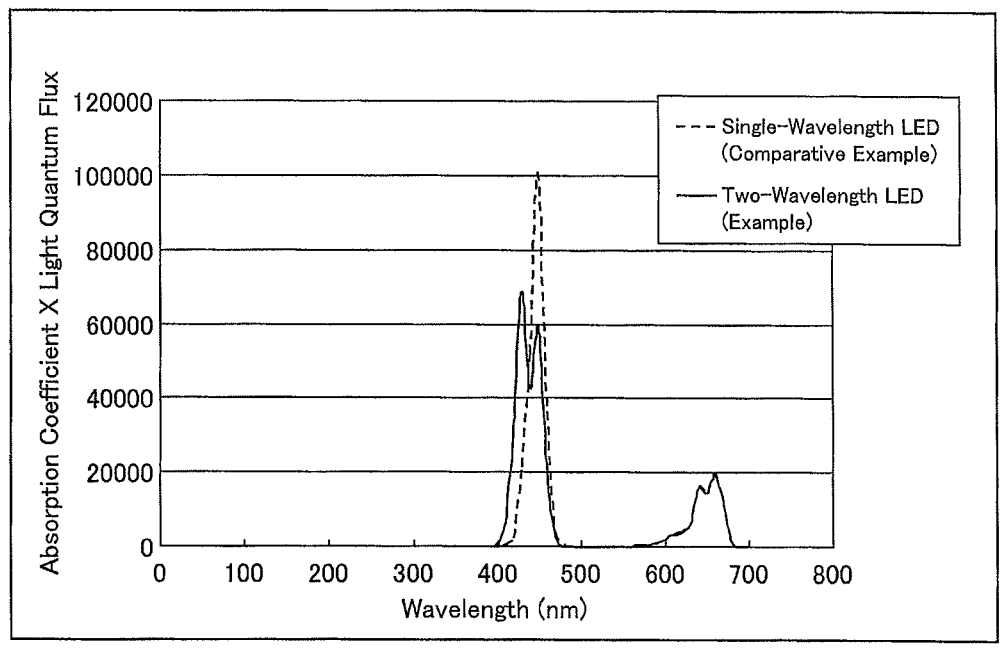
FIG. 10 shows a product of a photon flux of each wavelength multiplied by an absorption coefficient of chlorophyll, which product was obtained in Example of the present invention.

In order to evaluate how light having such a spectrum effects on chlorophyll, a chlorophyll absorption coefficient was multiplied by a light radiation flux of each wavelength, so that integrated intensities were compared with each other. A result of the comparison is shown in FIG. 10. As to the arrangement employing LEDs having two peak wavelengths (Example of the present invention), an integral value of the absorption coefficient and the light radiation flux was 308797. Meanwhile, as to the arrangement employing LEDs having one peak wavelength (Comparative Example), an integral value of the absorption coefficient and the light radiation flux was 298504. That is, the arrangement of Example of the present invention was improved by approximately 10000, as compared with the arrangement of Comparative Example. As such, it is considered that the lighting device having the arrangement employing LEDs having two peak wavelengths of 430 nm and 450 nm and the red fluorescent material (Example of the present invention) activates chlorophyll and promote growth of a plant, more greatly, as compared with the arrangement of Comparative Example.

(Conclusion of Present Invention)

A lighting device for growing a plant includes: not less than two sorts of semiconductor light-emitting element, each having a peak emission wavelength in a range of 380 nm to 500 nm, the not less than two sorts of semiconductor light-emitting element being different from each other in peak emission wavelength by not less than 5 nm; and a red fluorescent material which (i) is excited by light of at least one of the not less than two sorts of semiconductor light-emitting element and (ii) has a peak emission wavelength in a range of 600 nm to 780 nm.

According to the arrangement described above, a lighting device of the present invention, for growing a plant, supplies (i) light that has a peak emission wavelength in a blue color region (from 380 nm to 500 nm) and (ii) light that has a peak emission wavelength in a red color region (from 600 nm to 780 nm). The light having a peak emission wavelength in the blue color region and the light having a peak wavelength in the red color region can be absorbed easily by photosynthetic pigments (chlorophyll a, chlorophyll b, chlorophyll c, etc.) of a plant. Further, for the blue color region, the lighting device includes the not less than two sorts of semiconductor light-emitting element, which are different from each other in peak emission wavelength by not less than 5 nm. As such, the lighting device can supply light having a wavelength in a broad range. This makes it possible to provide light having an absorption wavelength for each of a wider variety of photosynthetic pigments. Accordingly, it becomes possible to cause a plant to grow efficiently. In addition, as compared with a case where a blue fluorescent material is excited by an ultraviolet LED to emit blue light, a semiconductor blue light-emitting element has a higher light-emitting efficiency. It is therefore possible to have a reduction in power consumption.

Furthermore, light in the red color region is generated by the red fluorescent material, which is excited by light generated by the semiconductor light-emitting element. As such, as compared with a case where a red LED is used to emit light, a half-value width becomes broad. This makes it possible to grow a plant efficiently. Moreover, as compared with a case where the red fluorescent material is excited by use of an ultraviolet LED, the power consumption can be reduced. This is because the semiconductor blue light-emitting element has a high light-emitting efficiency.

In addition to the arrangement described above, the lighting device of the present invention, for glowing a plant, is preferably arranged such that one(s) of the not less than two sorts of semiconductor light-emitting element has a peak wavelength in a range of ±40 nm of a peak value in a Soret band of an absorption spectrum of chlorophyll a and the other one(s) of the not less than two sorts of semiconductor light-emitting element has a peak wavelength(s) in a range of within ±40 nm of a peak value in a Soret band of an absorption spectrum of at least one of chlorophyll b and chlorophyll c.

According to the arrangement described above, it is possible to emit light toward chlorophyll, which is a main photosynthetic pigment functioning to obtain energy. It is therefore possible to promote photosynthesis.

Note that a Soret band indicates a strong absorption band in a range of an ultraviolet color region to a blue color region.

In addition to the arrangement described above, the lighting device of the present invention, for glowing a plant, is preferably arranged such that the red fluorescent material is constituted by not less than two sorts of red fluorescent material, which are different from each other in peak emission wavelength.

According to the arrangement described above, in a red color region, a range in which a wavelength can be supplied becomes broader. Accordingly, it becomes possible to emit light for absorption wavelengths of a wider variety of photosynthetic pigments. This makes it possible to grow a plant more efficiently.

In addition to the arrangement described above, the lighting device of the present invention, for glowing a plant, is preferably arranged such that the red fluorescent material is constituted by a bivalent europium-activated nitride fluorescent material represented by the following general formula (A)

$$(MIV_{1-c}Eu_c)MVSiN_3 \qquad (A)$$

(where: MIV represents at least one element selected from the group consisting of Mg, Ca, Sr, and Ba; MV represents at least one element selected from the group consisting of Al, Ga, In, Sc, Y, La, Gd, and Lu; and $0.001 \leq c \leq 0.15$ According to the arrangement described above, since the red fluorescent material has a broad half-value width of approximately 100 nm, the lighting device for growing a plant can supply light for a broader range of wavelength in the red color region. As such, it is possible to emit light for absorption wavelengths of a wider variety of photosynthetic pigments. This makes it possible to grow a plant more efficiently.

Further, it is possible to change the peak emission wavelength by adjusting an atomic composition ratio between Mg, Ca, and Sr of MIV in a general formula (A), or (ii) an element composition ratio of Eu with respect to that of MIV. As such, in manufacturing of a lighting device for growing a plant, it is possible to adjust a desired peak emission wavelength easily and precisely.

In addition to the arrangement described above, the lighting device of the present invention, for glowing a plant, is preferably arranged such that the red fluorescent material is constituted by not less than two sorts of red fluorescent material, which are different from each other in peak emission wavelength; and the not less than two sorts of red fluorescent material (i) are bivalent europium-activated nitride fluorescent materials, each being represented by the general formula (A) (where MIV represents a combination of Mg, Ca, and Sr), and (ii) are different from each other in an atomic composition ratio between Mg, Ca, and Sr of MIV.

According to the arrangement described above, an emission wavelength can be shifted toward a short wavelength side by increasing an atomic composition ratio of Sr with respect to that of Ca. On the other hand, an emission wavelength can be shifted toward a long wavelength side by increasing an atomic composition ratio of Mg with respect to that of Ca. As such, it becomes possible to produce easily the not less than two sorts of red fluorescent material, which are different from each other in emission wavelength.

In addition to the arrangement described above, the lighting device of the present invention, for glowing a plant, is preferably arranged such that the red fluorescent material is constituted by not less than two sorts of red fluorescent material, which are different from each other in peak emission wavelength; and
the not less than two sorts of red fluorescent material (i) are bivalent europium-activated nitride fluorescent materials, each being represented by the general formula (A), and (ii) are different from each other in an atomic composition ratio of Eu with respect to that of MIV.

According to the arrangement described above, an emission wavelength can be shifted toward a long wavelength side by increasing a composition of Eu with respect to that of MIV. As such, it becomes possible to produce the not less than two sorts of red fluorescent material, which are different from each other in emission wavelength.

In addition to the arrangement described above, the lighting device of the present invention, for glowing a plant, is preferably arranged such that a green fluorescent material for emitting green light having a wavelength which is more than 500 nm but less than 600 nm.

According to the arrangement described above, the lighting device of the present invention, for growing a plant, also emits light in a green color region (more than 500 nm but less than 600 nm). The light in the green color region has a high relative quantum efficiency (RQE), which indicates an ability of photon to cause photosynthesis. Further, it is known that the light in the green color region is also used for photosynthesis on an underside of a leaf, which light in a blue color region and light in a red color region are unlikely to reach. As such, the lighting device for growing a plant, having the arrangement described above, can promote photosynthesis of the entire leaf and grow a plant more efficiently.

Furthermore, the light in the green color region is excellent in visibility characteristic of a human body. It is therefore also possible to have an increase in workability.

In addition to the arrangement described above, the lighting device of the present invention, for glowing a plant, is preferably arranged such that a green fluorescent material which (i) is excited by light of at least one of the two sorts of semiconductor light-emitting element, and (ii) has a peak emission wavelength in a range of 480 nm to 600 nm.

According to the arrangement described above, the lighting device of the present invention, for growing a plant, can emit light in the green color region (more than 500 nm but less than 600 nm). The green fluorescent material emits light in a broad range, and emits light in a wide range in the green color region. A wavelength related to the photosynthesis is found through the entire green color range, as described above. As such, the lighting device of the present invention, for growing a plant, can grow a plant efficiently.

In addition to the arrangement described above, the lighting device of the present invention, for glowing a plant, is preferably arranged such that the green fluorescent material is $(Lu_{1-x}Ce_x)_3Al_5O_{13}$ ($0.001 \leq x \leq 0.05$).

According to the arrangement described above, the green fluorescent material has a wide half-value width of approximately 100 nm. As such, the lighting device of the present invention, for growing a plant, can supply light for a broader range of the wavelength in the green color region. Accordingly, it becomes possible to emit light for absorption wavelengths of a wider variety of photosynthetic pigments. This makes it possible to grow a plant more efficiently.

In addition to the arrangement described above, the lighting device of the present invention, for glowing a plant, is preferably arranged such that the not less than two sorts of semiconductor light-emitting element are connected to each other in series so as to form not less than two groups; the not less than two groups are connected in parallel with each other; and the not less than two groups are identical with each other in the number of semiconductor light-emitting elements of each of the not less than two sorts of semiconductor light-emitting element.

According to the arrangement described above, the not less than two groups, connected in parallel with each other, are identical with each other in a forward voltage. As such, it is possible to drive the lighting device without having differences between the not less than two groups in current value. It is therefore possible to have a reduction in differences of coloring (wavelength) between parts of the lighting device. Accordingly, it is possible to supply a plant with blue light synthesized homogeneously.

In addition to the arrangement described above, the lighting device of the present invention, for glowing a plant, is preferably arranged such that the not less than two sorts of semiconductor light-emitting element are arranged such that, among the not less than two sorts of semiconductor light-emitting element, semiconductor light-emitting elements which are identical with each other in peak emission wavelength are not placed next to each other.

According to the arrangement described above, semiconductor light-emitting elements that are different from each other in peak emission wavelength are placed next to each other. Accordingly, it is possible to supply a plant with blue light synthesized homogeneously.

In addition to the arrangement described above, the lighting device of the present invention, for glowing a plant, is preferably arranged such that each of the not less than two sorts of semiconductor light-emitting element is constituted by a nitride semiconductor.

According to the arrangement described above, the nitride semiconductor can control a wavelength in a broad range and has a high light-emitting efficiency in a range of 380 nm to 500 nm.

Further, the scope of the present invention includes a blue light lighting device including: not less than two sorts of semiconductor light-emitting element, each having a peak emission wavelength in a range of 380 nm to 500 nm, which range is a range of an absorption wavelength of a photosynthetic pigment, the not less than two sorts of semiconductor light-emitting element being different from each other in peak emission wavelength by not less than 5 nm.

According to the arrangement of the blue light lighting device described above, the lighting device of the present invention, for growing a plant, supplies light having a peak emission wavelength in a blue color region (from 380 nm to 500 nm). The light having a peak emission wavelength in the blue color region can be absorbed easily by photosynthetic pigments (chlorophyll a, chlorophyll b, chlorophyll c, etc.) of a plant. Further, the lighting device of the present invention includes the not less than two sorts of semiconductor light-emitting element, which are different from each other in peak emission wavelength by not less than 5 nm. This makes it possible to emit light for absorption wavelengths of a wider variety of photosynthetic pigments. It is therefore possible to grow a plant efficiently. In addition, as compared with a case where a blue fluorescent material is excited by use of an ultraviolet LED to emit blue light, it is possible to have a reduction in power consumption. This is because the semiconductor blue light-emitting element has a higher light-emitting efficiency.

INDUSTRIAL APPLICABILITY

A lighting device of the present invention, for growing a plant, makes it possible to grow a plant efficiently with low power consumption. The lighting device is also applicable to a medical field. For example, since chlorophyll is likely to adhere to a cancer cell, there has been known such a method that (i) chlorophyll is excited by light so as to produce singlet molecular oxygen, and, as a result, (ii) the cancer cell is destroyed selectively. In a case where the lighting device of the present invention, for growing a plant, is used in this method, it becomes possible to excite chlorophyll more efficiently.

REFERENCE SIGNS LIST

1: LED element (semiconductor light-emitting element)
2: LED element (semiconductor light-emitting element)
3: LED element (semiconductor light-emitting element)
4: Wiring line
5: Gold
6: Cathode electrode
7: Anode electrode
8: Substrate
9: Pad electrode (Cathode)
10: Pad electrode (Anode)
11: Sealing reign
12: Red fluorescent material
13: Sealing reign containing fluorescent material
14: Power supply
15: Top board
16: LED package
17: Aluminum frame
18: Plant
19: Pot
20: Soil

The invention claimed is:

1. A lighting device for growing a plant comprising:
a first semiconductor light-emitting element, a second semiconductor light-emitting element and a third semiconductor light-emitting element each having a peak emission wavelength in a range of 380 nm to 500 nm, the first semiconductor light-emitting element, the second semiconductor light-emitting element and the third semiconductor light-emitting element being different from each other in peak emission wavelength by not less than 5 nm; and
a red fluorescent material which (i) is excited by light of at least one of the first semiconductor light-emitting element, the second semiconductor light-emitting element and the third semiconductor light-emitting element and (ii) has a peak emission wavelength in a range of 600 nm to 780 nm,
the first semiconductor light-emitting element, the second semiconductor light-emitting element and the third semiconductor light-emitting element being connected in this order so as to constitute a single unit, (i) two or more of the units being connected to each other in series to constitute a semiconductor light-emitting element group, (ii) two or more of the semiconductor light-emitting element groups being connected to each other in parallel, and (iii) the two or more of the semiconductor light-emitting element groups being identical with each other in the number of the first semiconductor light-emitting elements, the number of the second semiconductor light-emitting elements and the number of the third semiconductor light-emitting elements,
the first semiconductor light-emitting element, the second semiconductor light-emitting element and the third semiconductor light-emitting element being controlled together by a single power supply circuit.

2. The lighting device as set forth in claim 1, wherein:
the first semiconductor light-emitting element has a peak wavelength in a range of ±40 nm of a peak value in a Soret band of an absorption spectrum of chlorophyll a;
the second semiconductor light-emitting element has a peak wavelength in a range of within ±40 nm of a peak value in a Soret band of an absorption spectrum of chlorophyll b; and
the third semiconductor light-emitting element has a peak wavelength in a range of within ±40 nm of a peak value in a Soret band of an absorption spectrum of chlorophyll c.

3. The lighting device as set forth in claim 1, wherein:
the red fluorescent material is constituted by not less than two sorts of red fluorescent material, which are different from each other in peak emission wavelength.

4. The lighting device as set forth in claim 1, wherein:
the red fluorescent material is constituted by a bivalent europium-activated nitride fluorescent material represented by the following general formula (A):

$$(MIV_{1-c}Eu_c)MVSiN_3 \quad (A)$$

(where: MIV represents at least one element selected from the group consisting of Mg, Ca, Sr, and Ba; MV represents at least one element selected from the group consisting of Al, Ga, In, Sc, Y, La, Gd, and Lu; and $0.001 \leq c \leq 0.15$).

5. The lighting device as set forth in claim 4, wherein:
the red fluorescent material is constituted by not less than two sorts of red fluorescent material, which are different from each other in peak emission wavelength; and
the not less than two sorts of red fluorescent material (i) are bivalent europium-activated nitride fluorescent materials, each being represented by the general formula (A) (where MIV represents a combination of Mg, Ca, and Sr), and (ii) are different from each other in an atomic composition ratio between Mg, Ca, and Sr of MIV.

6. The lighting device as set forth in claim 4, wherein:
the red fluorescent material is constituted by not less than two sorts of red fluorescent material, which are different from each other in peak emission wavelength; and
the not less than two sorts of red fluorescent material (i) are bivalent europium-activated nitride fluorescent materials, each being represented by the general formula (A), and (ii) are different from each other in an atomic composition ratio of Eu with respect to that of MIV.

7. The lighting device as set forth in claim 1, further comprising:
a green fluorescent material for emitting green light having a wavelength which is more than 500 nm but less than 600 nm.

8. The lighting device as set forth in claim 1, further comprising:
a green fluorescent material which (i) is excited by light of at least one of the first semiconductor light-emitting element, the second semiconductor light-emitting element and the third semiconductor light-emitting element, and (ii) has a peak emission wavelength in a range of 480 nm to 600 nm.

9. The lighting device as set forth in claim 8, wherein:
the green fluorescent material is $(Lu_{1-x}Ce_x)_3Al_5O_{13}$ $(0.001 \leq x \leq 0.05)$.

10. The lighting device as set forth in claim 1, wherein:
the first semiconductor light-emitting element, the second semiconductor light-emitting element and the third semiconductor light-emitting element are arranged such that, among the not less than two sorts of semiconductor light-emitting element, semiconductor light-emitting elements which are identical with each other in peak emission wavelength are not placed next to each other.

11. The lighting device as set forth in claim 1, wherein:
each of the not less than two sorts of semiconductor light-emitting element is constituted by a nitride semiconductor.

12. A blue-light lighting device comprising:
a first semiconductor light-emitting element, a second semiconductor light-emitting element and a third semiconductor light-emitting element each having a peak emission wavelength in a range of 380 nm to 500 nm, which range is a range of an absorption wavelength of a photosynthetic pigment, the first semiconductor light-emitting element, the second semiconductor light-emitting element and the third semiconductor light-emitting element being different from each other in peak emission wavelength by not less than 5 nm,
the first semiconductor light-emitting element, the second semiconductor light-emitting element and the third semiconductor light-emitting element being connected in this order so as to constitute a single unit, (i) two or more of the units being connected to each other in series to constitute a semiconductor light-emitting element group, (ii) two or more of the semiconductor light-emitting element groups being connected to each other in parallel, and (iii) the two or more of the semiconductor light-emitting element groups being identical with each other in the number of the first semiconductor light-emitting elements, the number of the second semiconductor light-emitting elements and the number of the third semiconductor light-emitting elements,
the first semiconductor light-emitting element, the second semiconductor light-emitting element and the third semiconductor light-emitting element being controlled together by a single power supply circuit.

13. The lighting device as set forth in claim 1, wherein:
the first semiconductor light-emitting element, the second semiconductor light-emitting element and the third semiconductor light-emitting element are configured so as to have peak emission wavelengths in a range of ±40 nm of a peak absorption wavelength of a chlorophyll.

* * * * *